United States Patent
Koen et al.

(10) Patent No.: US 6,642,795 B2
(45) Date of Patent: Nov. 4, 2003

(54) FAST RECOVERY TIME PRECISION AMPLIFIER

(75) Inventors: Myron J. Koen, Tucson, AZ (US); Harish Venkataraman, Tucson, AZ (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/160,704

(22) Filed: May 30, 2002

(65) Prior Publication Data

US 2003/0151462 A1 Aug. 14, 2003

Related U.S. Application Data

(60) Provisional application No. 60/355,966, filed on Feb. 11, 2002.

(51) Int. Cl.[7] .............................. H02H 7/20; H03F 3/04
(52) U.S. Cl. .................... 330/298; 330/207 P; 330/86; 327/309
(58) Field of Search ...................... 330/86, 110, 207 P, 330/254, 282, 298, 255; 327/309, 310

(56) References Cited

U.S. PATENT DOCUMENTS

| | | | | |
|---|---|---|---|---|
| 5,276,405 A | * | 1/1994 | Mazzucco et al. | 330/257 |
| 5,281,800 A | * | 1/1994 | Pelton et al. | 235/462 |
| 5,663,673 A | * | 9/1997 | Tanaka et al. | 327/412 |
| 5,880,618 A | | 3/1999 | Koen | |
| 6,229,375 B1 | | 5/2001 | Koen | |
| 6,359,517 B1 | * | 3/2002 | Colaco | 330/308 |
| 6,456,142 B1 | * | 9/2002 | Gilbert | 327/356 |

OTHER PUBLICATIONS

C. Toumazou et al., *Extending voltage–mode op amps to current–mode performance*, IEE Proceedings, vol. 137, Pt. G, No. 2, Apr. 1990, pp. 116–130.

* cited by examiner

*Primary Examiner*—Henry Choe
(74) *Attorney, Agent, or Firm*—W. Daniel Swayze, Jr.; W. James Brady; Frederick J. Telecky, Jr.

(57) ABSTRACT

An amplifier with a electrically controllable gain and enhanced protection against an overload condition is disclosed. The amplifier contains a buffer amplifier configured to convert an input voltage signal to a current signal and an output amplifier that converts a current signal to an output voltage signal. The gain of the amplifier can be controlled by an internal resistor that can be electrically configured to different resistance levels. The amplifier also includes a clamping network used to clamp the output amplifier to prevent an overload condition. This network may take the form of a diode network. Such an amplifier may take the form of a differential amplifier.

15 Claims, 7 Drawing Sheets

FAST RECOVERY TIME PRECISION AMPLIFIER

CROSS-REFERENCE TO RELATED APPLICATIONS

This application claims priority from U.S. Provisional patent application serial No. 60/355,966, filed Feb. 11, 2002.

FIELD OF INVENTION

This invention generally relates to electronic amplifier circuits and more particularly to an amplifier with .a fast recovery time.

BACKGROUND OF THE INVENTION

Amplifiers are commonly used to provide gain to an electric signal. For example, if a voltage amplifier has a voltage gain of 10, then an input signal of 50 millivolts ("mV") applied to the voltage amplifier results in an output signal of 500 mV. An amplifier typically has a range in which the amplifier operates in a linear manner. For example, a voltage amplifier connected to a 5-volt power supply may be linear for outputs up to 4.5 volts. However, driving output voltages greater than 4.5 volts may force the amplifier into non-linearity, resulting in distortion from the amplifier. Thus, a problem may develop when the input signal multiplied by the gain of the amplifier exceeds the output capability of the amplifier. For example, an input signal greater than 450 mV in the above-described voltage amplifier (with a voltage gain of 10) may result in distortion of the output signal of the amplifier.

When the linear range of an amplifier is exceeded, some of the internal nodes of the amplifier may be driven beyond their normal operating range, causing the amplifier to operate in a non-linear mode. When an amplifier operates above its designed linear range, non-linearities, distortion, and instability in the output signal may result. Moreover, even after the amplifier returns to its linear operating range, it may take some time for the device to recover and resume operating in its normal state. Such a recovery period, which may take several or even hundreds of nanoseconds, may be unacceptable when a device is used in high-frequency applications, particularly if the amplifier may be required to respond to input signals at a very high rate.

For some applications, these recovery limitations are not critical, because the input voltages can be limited to the linear region. However, in certain applications, the range of input voltages can be very wide. For example, in certain ultrasound applications, sound waves are transmitted into a human body and the reflected echo is detected and converted to an electrical output, e.g., an output that can be displayed on a video monitor. A large object within the body may result in a high-amplitude signal being applied to the ultrasound sensor. The ultrasound system may need to recover from the large input signal before it can effectively resolve other signals. However, because an ultrasound system typically operates in real-time, such a delay is undesirable as it may result in the non-detection of, e.g., a small tumor, because of the nearby presence of a large object.

Presently known systems have addressed this problem by either clamping the input signal or the output signal from an amplifier. However, such a configuration may not be desirable for various reasons. For example, high gain amplifiers may overload with even relatively small input signals, making it difficult to integrate a clamping network for low-level input signals. Clamping at the output port may be easier to implement, but may not prevent the various internal sections of an amplifier from overloading in response to high amplitude input signals. Clamping at the output port may also lead to instability or even oscillation because the loop gain of the amplifier may be dynamically changed when the clamp function is activated.

An amplifier control circuit is thus desired which overcomes the shortcomings of the prior art.

SUMMARY OF THE INVENTION

An amplifier with a network used to clamp the output amplifier to prevent an overload condition is disclosed. The amplifier may also include an electrically controllable gain function exhibiting enhanced protection against overload. The amplifier circuit contains a buffer amplifier that converts an input voltage signal to a current signal and an output amplifier that converts a current signal to an output voltage signal. An internal resistance that can be electrically configured to various desired levels may control the gain of the amplifier.

Also disclosed is a method of amplifying an input signal. The voltage of the input signal is sensed and the input signal is converted to a current signal. A transimpedance amplifier converts the current signal into an output voltage signal. The output voltage signal is clamped if the voltage exceeds a predetermined value. The conversion of the voltage signal to a current signal may encompass the use of a resistor. This conversion may be configured to depend on the resistance value. Furthermore, the resistance may be varied to control the gain of the amplification.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION

The present invention will be described herein in terms of various functional components and various processing steps. It should be appreciated that such functional components may be realized by any number of hardware or structural components configured to perform the specified functions. For example, the present invention may employ various integrated components comprised of various electrical devices, e.g., resistors, transistors, capacitors, diodes and the like, whose values may be suitably configured for various intended purposes. In addition, the present invention may be practiced in any integrated circuit application in which a precision amplifier with a fast recovery time is desired. However, for purposes of illustration only, exemplary embodiments of the present invention will be described herein in connection with amplifiers used in ultrasound systems. Further, it should be noted that while various components may be suitably coupled or connected to other components within exemplary circuits, such connections and couplings can be realized by direct connection between components, or by connection through other components or devices located therebetween.

An exemplary embodiment of the present invention relates to a circuit that integrates a clamping function into an amplifier such that the input signal tends to remain within the linear region of the amplifier. Such a clamping function protects the output signal from exceeding the linear range of the amplifier. By avoiding the clamping of the input signal, the amplifier is able to handle large input signals. Yet the clamping is integrated into the amplifier such that the amplifier output signal remains stable and free of oscillation. An exemplary embodiment may also contain a variable resistance element configured such that varying the resistance of the variable resistance results in a change in the gain of the amplifier.

Figure 1:
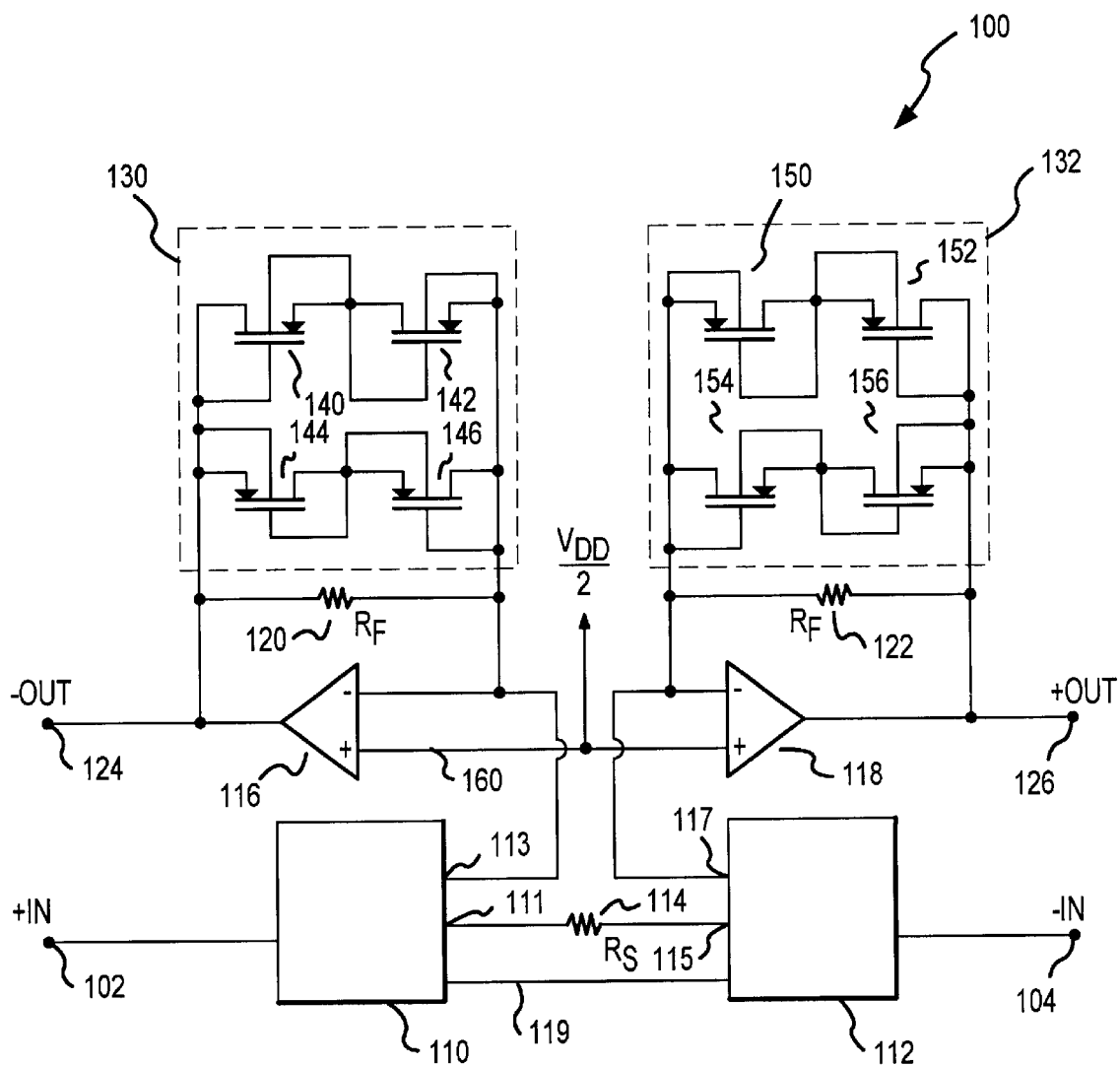
FIG. 1 is a schematic circuit diagram of an exemplary embodiment of an amplifier of the present invention using differential signals.

With reference to FIG. 1, an overview of an embodiment of an amplifier used for differential input signals is presented. The amplifier 100 includes a pair of input amplifiers 110 and 112, which may be configured to convert a voltage signal to a current signal. Coupled to each of input amplifiers 110 and 112 is an output amplifier with a clamping circuit. The output signals of circuit 100 are obtained from the output ports of the output amplifiers.

More particularly, a differential input signal is coupled, via positive input port 102 and negative input port 104, to input amplifier 110 and input amplifier 112. In one embodiment, input amplifiers 110 and 112 may be similarly or even identically configured buffers that generate an output current signal from an input voltage signal applied to input ports 102 and 104. The internal structure of an exemplary embodiment of input amplifiers 110 and 112 will be described in more detail infra.

Input amplifiers 110 and 112 may each be configured to generate an output current signal through the use of a resistor $R_s$ (114) located between ports 111 and 115. The output current signals propagate to output amplifiers 116 and 118, respectively, via output ports 113 and 117, respectively. A feedback resistor $R_f$(120) is suitably coupled to the negative input of output amplifier 116. In a similar manner, a similarly configured feedback resistor Rf (122) is coupled to the negative input of output amplifier 118. The positive inputs of amplifiers 116 and 118 are coupled together and to a bias voltage 160. In one embodiment of the present invention, bias voltage 160 is one-half the supply voltage. A negative output signal of the differential amplifier is obtained from output port 124 and a positive output signal of the differential amplifier is obtained from output port 126.

Clamping networks 130 and 132 are integrated with the above elements. Clamping networks 130 and 132 serve to clamp amplifiers 116 and 118, respectively. When the voltage across Rf (120 and 122) is within the operating range of amplifiers 116 and 118, clamping networks 130 and 132 are open circuits, allowing the current to flow through Rf. However, when the voltage across Rf is large enough to activate clamping networks 130 and 132, excess current is shunted through the clamping network to help prevent an overload condition within amplifiers 116 and 118 (also known as clamping). Thus, instead of having to recover an amplifier in an overload condition, which may take an excessively long time, the only components that need to recover to return to a ready condition are the diodes within clamping networks 130 and 132. In an exemplary embodiment, both clamping network 130 and 132 clamp the output signal at a level of approximately 3.2 volts (peak-to-peak), which is within the linear range of amplifiers 116 and 118.

Clamping network 130 may take one of several different forms. For example, clamping network 130 may comprise diode-connected transistors 140, 142, 144, and 146, while clamping network 132 comprises diode-connected transistors 150, 152, 154, and 156. Each of the diodes (140, 142, 144, 146, 150, 152, 154, and 156) is preferably configured to have a rapid recovery time, thus enabling the diode networks to react to excessive inputs in a quick manner. Furthermore, stability issues are generally avoided because amplifiers 116 and 118, in conjunction with feedback resistors 120 and 122, each have a low gain, which makes compensating the frequency response of the output amplifier more straightforward.

Figure 4:
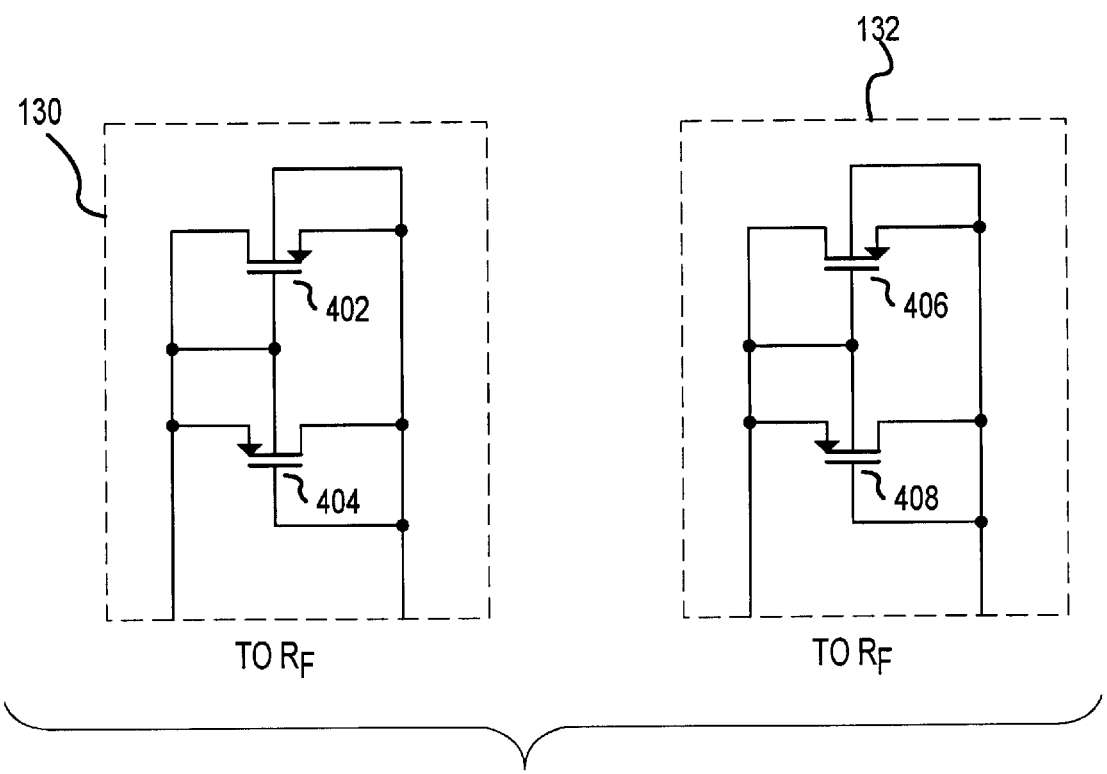
FIG. 4 is a schematic circuit diagram for use in the circuit of FIG. 1.

A circuit schematic showing another exemplary layout of diode networks 130 and 132 is presented in FIG. 4. It can be seen that diode network 130 comprises two diode-connected transistors 402 and 404. In a similar manner, diode network 132 comprises two diode-connected transistors 406 and 408. Two diode-connected transistors may not be able to handle voltage swings as large as can four diode-connected transistors. Therefore, the embodiment shown in FIG. 4 may be more suited for situations where the range of output voltage signals encountered is not as large. However, clamping networks 130 and 132 may comprise any configuration of diodes and/or diode-connected transistors configured for clamping the output signals of output amplifiers 116 and 118.

Figure 2:
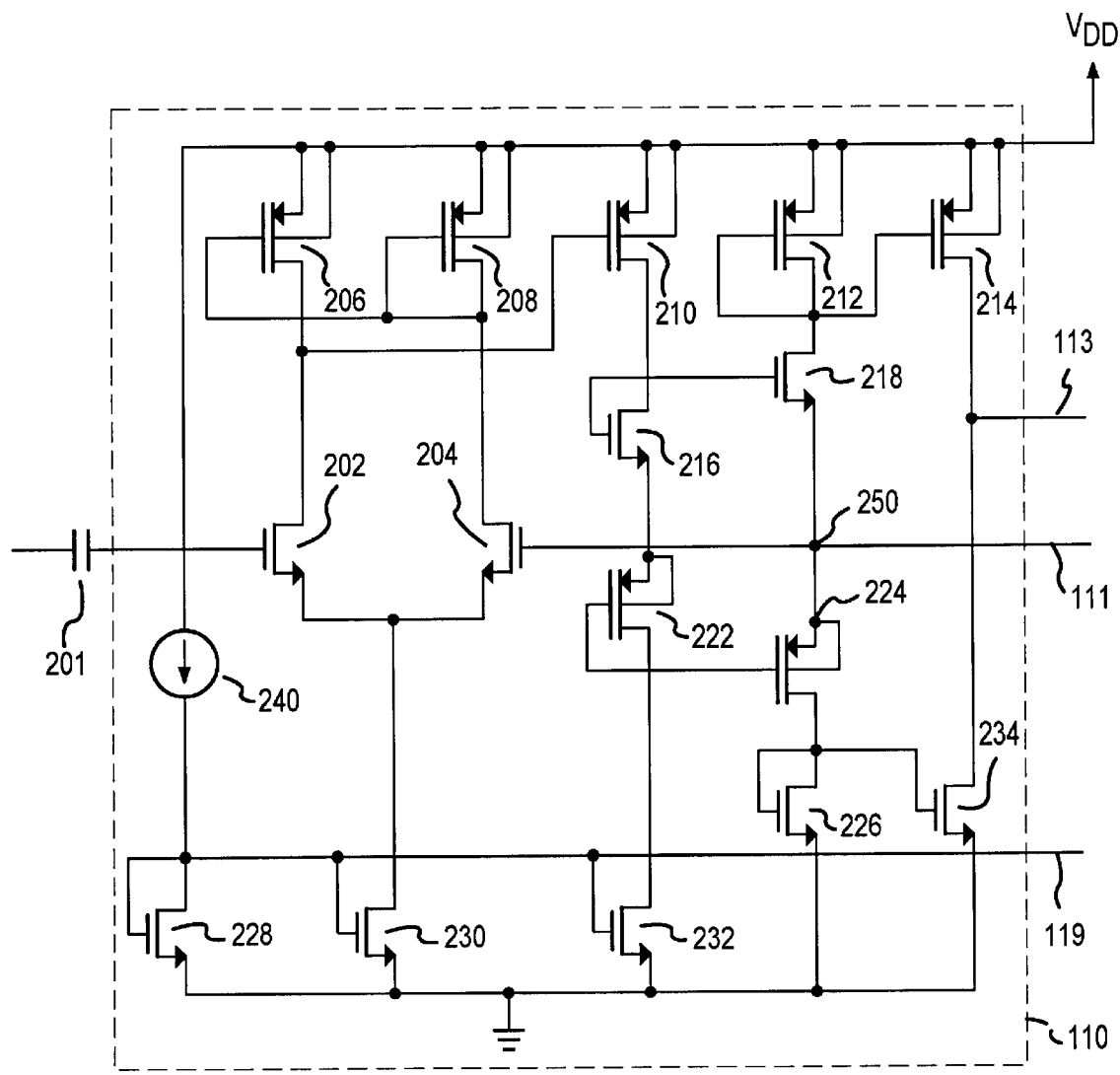
FIGS. 2 and 3 are schematic circuit diagrams of exemplary implementations used in the circuit of FIG. 1.

Input amplifier 110 may be configured in various manners for generating an output current signal. For example, with reference to FIG. 2, a circuit schematic showing further details of an exemplary embodiment of input amplifier 110 is presented. Amplifier 110 is a buffer configured to convert an input voltage signal to an output current signal from an input voltage signal. In an exemplary embodiment, amplifier 110 comprises an input stage, an output stage, a current supply stage, and a load stage. The input signal flows through capacitor 201 into the input stage comprising transistors 202 and 204, biased by transistor 230, transistors 206 and 208 acting as the load stage. The signal then propagates to the output stage, comprising transistors 216, 218, 222, and 224 and culminating in a voltage node 250 coupled to output port 111. Transistors 212, 214, 226, and 234 are configured to provide a current mirror function to convert the voltage signal into a current signal. Current source 240 serves to produce an overall bias for the amplifier.

Figure 3:
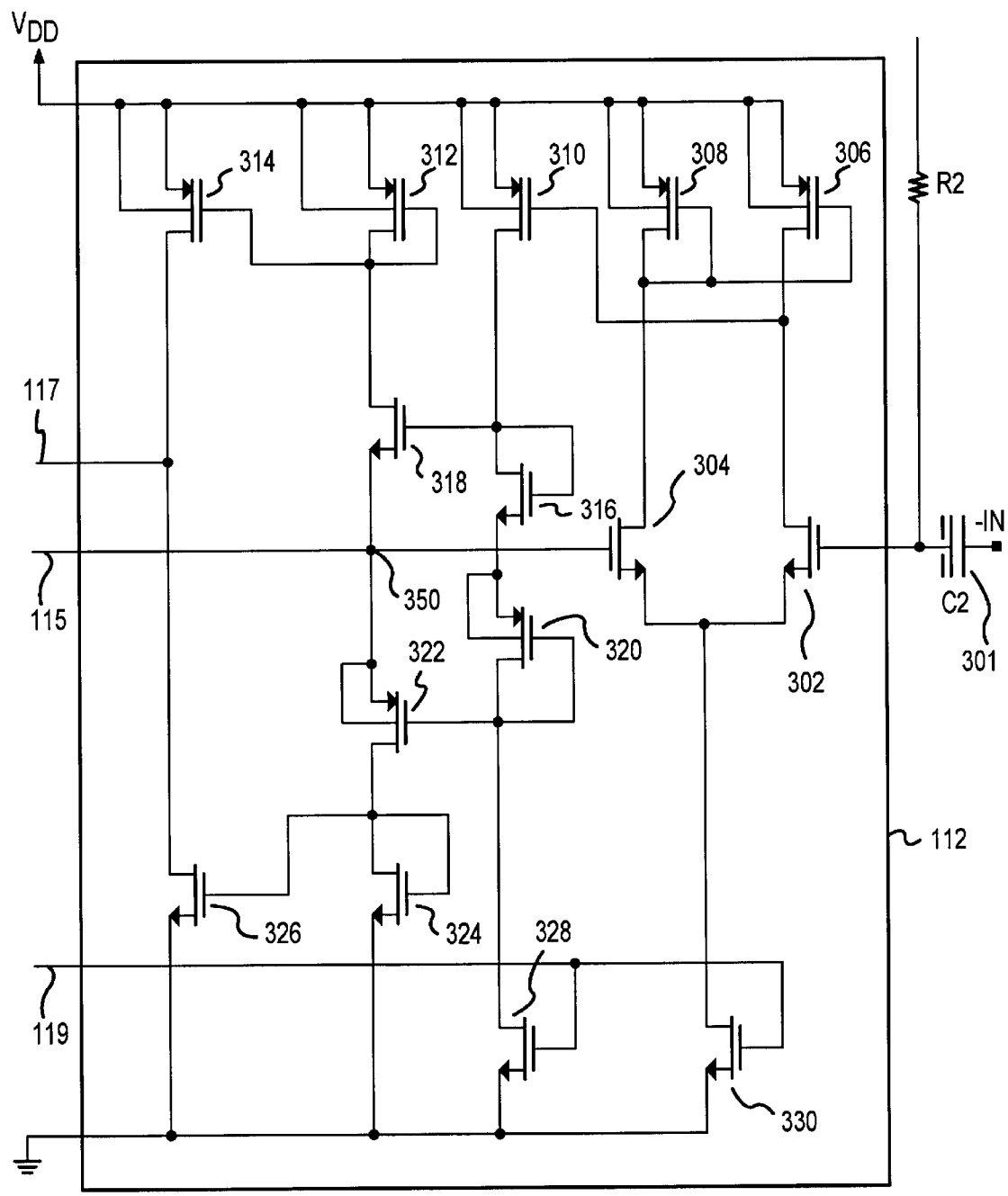

In certain embodiments, amplifiers 110 and 112 would be identical. However, there are various configurations that are possible for amplifiers 110 and 112. For example, FIG. 3 presents the internal structure of an exemplary amplifier 112 in another embodiment of the present invention. In an exemplary embodiment, amplifier 112 comprises an input stage, an output stage, a current supply stage, and a load stage. The input voltage signal flows through capacitor 301 into the input stage comprising transistors 302 and 304, biased by transistor 330, with transistors 306 and 308 acting as load elements. The signal then propagates to the next stage, comprising transistors 316, 318, 320 and 322 and culminating in a voltage node 350 coupled to output port 115. Transistors 312, 314, 324, and 326 are configured to provide a current mirror function to convert the voltage signal into a current signal. A bias voltage applied to line 119 biases current sources 328 and 330.

With reference again to FIG. 1, the current flowing through resistor 114 can be expressed as the difference in voltage from ports 111 and 115, i.e., from node 250 and node 350, divided by the value of resistor Rs (114). The positive output current is input into amplifier 116 while the negative output current is input into amplifier 118. The voltage at the output of amplifier 116 can thus be expressed as the product of (V1–V2) and (Rf/Rs), where V1 is the voltage at port 111, V2 is the voltage at port 115, Rf is the resistance of resistor 120 (in ohms), and Rs is the resistance of resistor 114. The voltage at the output of amplifier 118 is approximately equal, but of opposite polarity to the output voltage of amplifier 116.

The gain of the amplifier 100 is thus inversely proportional to the resistance of resistor 114. It would be desirable to have the resistance of resistor 114 be adjustable such that the gain of the amplifier could be adjusted.

Thus, in accordance with another embodiment of the present invention, resistor 114 comprises dynamically adjustable configuration. For example, such a dynamically adjustable resistor can be a logarithmically controlled resistive attenuator having a single series resistive element coupled between two conductors (input and output) and a plurality of parallel resistive elements each having a terminal coupled to the output conductor. Through the use of various control signals, a resistance that varies logarithmically based on input signals is produced. Thus, the gain of amplifier 100 can be adjusted through the programming of resistor 114.

Such a configuration can be constructed through the use of one or more metal oxide field effect transistors ("MOSFETs"). A MOSFET can function as a voltage controlled switch and/or as a voltage controlled resistor, so it is intended that a particular MOSFET can function as either and/or both.

Figure 5:
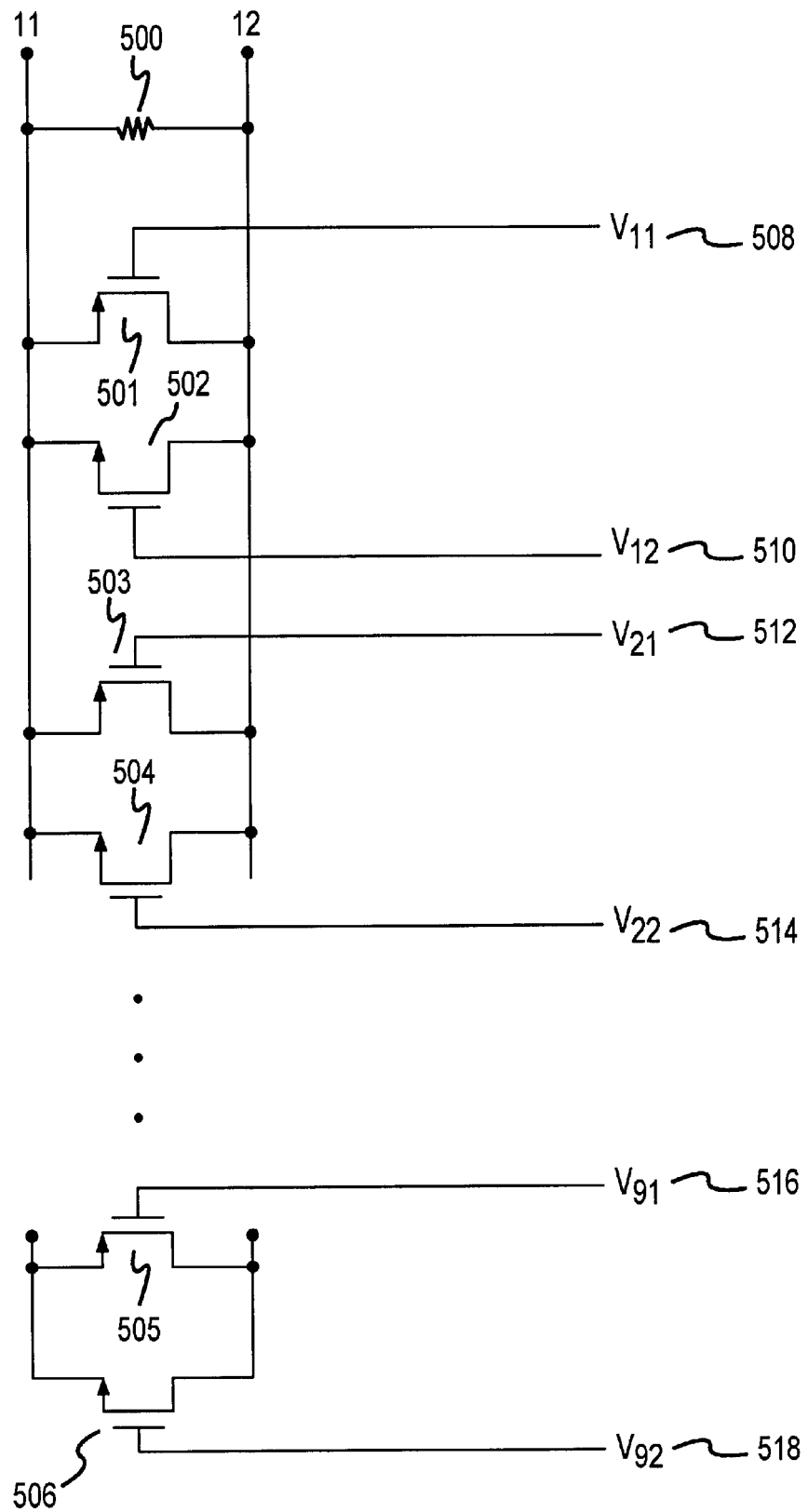
FIG. 5 is a schematic circuit diagram of a variable resistor for use in the circuit of FIG. 1.

With reference now to FIG. 5, a schematic circuit diagram of an exemplary configuration of resistor 114 of the present invention is presented. One resistor 500 is connected between terminal 11 and terminal 12. A plurality of parallel transistors, for example, transistors 501, 502, 503, 504, 505, and 506, are each connected directly to terminal 11 and to terminal 12. Each pair of transistors may be termed a transistor pair. For example, transistors 501 and 502 comprise a transistor pair that represents a resistive element. The gates of transistors 501, 502, 503, 504, 505, and 506 are respectively connected to receive the sequential control voltages 508, 510, 512, 514, 516, and 518. It should be understood that any number of transistors may be used to implement this function.

Figure 6:
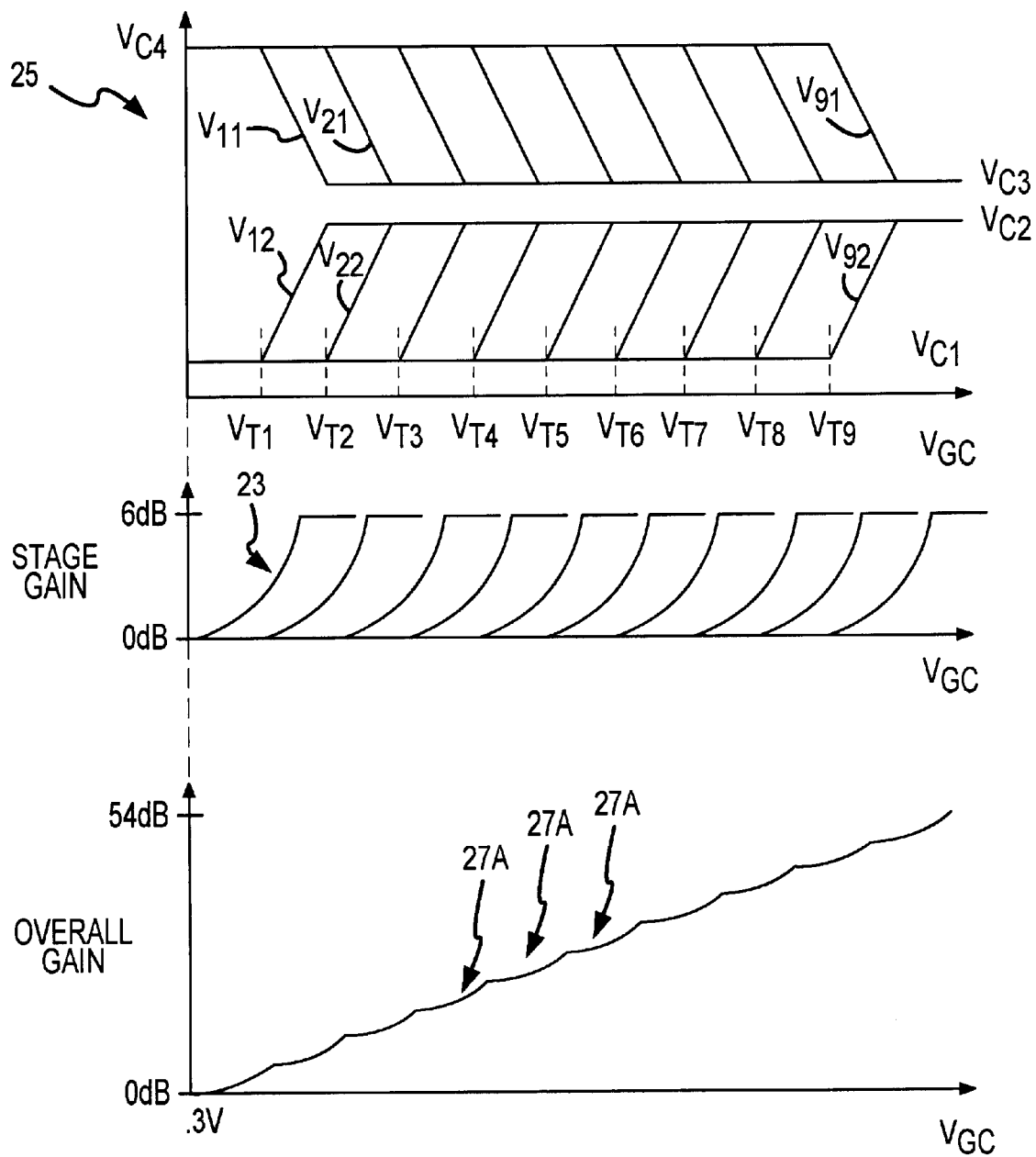
FIG. 6 is a diagram showing transfer characteristics of the individual attenuator stages of the variable resistor of FIG. 5.

With reference to FIG. 6, a graph illustrating the operation of resistor 114 is shown. The curves designated by numeral 25 show how each of the piecewise-linear individual attenuator section control voltages V11, V21, ..., V91, decreases from $V_{c4}$ to +$V_{c3}$ volts and then levels off at $V_{c3}$ volts as the gain control voltage $V_{GC}$ is increased to first equal and then to exceed the threshold voltages $V_{T1, 2, ..., 9}$, respectively. Curves 23 in FIG. 6 illustrate the non-logarithmic responses (in dB) of each of the stages as the parallel MOSFETS are successively turned off by increasing $V_{GC}$. The resistance of each of such resistor sections decreases the overall parallel resistance by a factor of 2 as its control voltage V11, V21, ..., V91 gradually increases from $V_{c1}$ volts to +$V_{c2}$ volts and decreases from $V_{c4}$ volts to $V_{c3}$ volts. This causes the total gain of the amplifier to have the composite logarithmic gain indicated by curve 27 in FIG. 6, increasing from 0 db with $V_{GC}$ at 0.3 volts to 54 dB when $V_{GC}$ is at +3.0 volts. The overlapping of the individual gain curve characteristics in response to the individual signals V11, V12, ..., V92 (curves 25 of FIG. 6) results in a generally linear, but slightly "scalloped" appearance with successive "cusps" 27A.

The on resistances of the parallel transistors, e.g., transistors 501, 502, ..., 506, may not be equal in an exemplary embodiment of the present invention. The channel-width to channel-length ratios of parallel transistors 501, 502, 503, 504, 505, and 506 may be progressively larger, so their on resistances are progressively lower. Specifically, as the parallel transistors 501, 502, 503, 504, 505, and 506 are progressively turned on (typically parallel transistors 501 and 502 first, followed by transistors 503, 504, 505, and 506), the resistance is decreased by a fixed number of decibels("dB"). For example, for 6 dB of gain per parallel resistive n-channel/p-channel pair, the W/L ratio of parallel transistors 503, 504, etc., is greater than that of the previous parallel transistor pair. Thus, relatively linear, low-noise, piecewise logarithmic gain control is achieved as the sequential control voltage pairs 508 and 510, 512 and 514, and 516 and 518 are progressively applied.

Figure 7A:
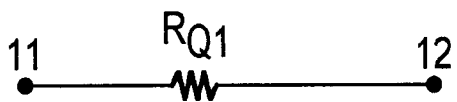
FIGS. 7A–7C are schematic electric circuits of alternate embodiments of the variable resistor shown in FIG. 5.
Figure 7B:
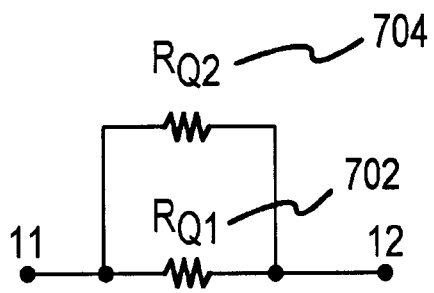
Figure 7C:
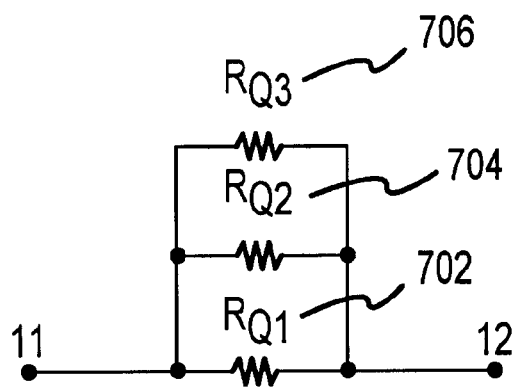

The operation of the circuit of FIG. 5 will now be explained, with reference to the equivalent circuit schematics of FIGS. 7A to 7C. The equivalent circuit of the logarithmic element of FIG. 6, before the first control voltage V11 and V12 is applied, is shown in FIG. 7A. The on resistance RQ1 (702) provides the only resistance between conductors 11 and 12. FIG. 7B shows the equivalent circuit after Q1 has been turned on by voltage signal V11 and V12. The addition of the parallel resistance RQ2 (704) in FIG. 7B provides 6 dB additional gain between conductors 11 and 12. To achieve linearity of the logarithmic gain, an equal additional amount of gain is provided when parallel transistor Q3 is turned on by V21 and V22. This is shown in the equivalent circuit of FIG. 7C, in which the on resistance RQ3 (706) of RQ3 is added in parallel with RQ2, wherein in order to obtain the equal additional attenuation, the channel resistance RQ3 would be substantially lower than RQ2. Similarly, the on resistance of transistor RQ4 would be lower than that of shunt transistor RQ3 (not shown in FIGS. 7A–7C).

The above description presents exemplary modes contemplated in carrying out the invention. The techniques described above are, however, susceptible to modifications and alternate constructions from the embodiments shown above. Other variations and modifications of the present invention will be apparent to those of ordinary skill in the art, and it is the intent of the appended claims that such variations and modifications be covered. For example, while the invention has been described with respect to ultrasound systems, it should be understood that the present invention could be used in a variety of different applications.

Consequently, it is not the intention to limit the invention to the particular embodiments disclosed. On the contrary, the invention is intended to cover all modifications and alternate constructions falling within the scope of the invention, as expressed in the following claims when read in light of the description and drawings. No element described in this specification is necessary for the practice of the invention unless expressly described herein as "essential" or "required."

We claim:

1. A differential amplifier comprising:
   a first buffer amplifier;
   a second buffer amplifier coupled to said first buffer amplifier; first output amplifier coupled to said second buffer amplifier;
   a second output amplifier;
   a first resistor;
   a second resistor;
   a third resistor;
   a first diode network configured to prevent an overload condition for said first output amplifier; and
   a second diode network configured to prevent an overload condition for said second output amplifier; wherein:
     said first resistor is coupled in a feedback loop to said first output amplifier;
     said second resistor is coupled in a feedback loop to said second output amplifier;
     said first buffer amplifier is coupled to said second buffer amplifier via said third resistor;
     said first diode network is coupled in parallel to said first resistor; and
     said second diode network is coupled in parallel to said second resistor.

2. The amplifier of claim 1 wherein said first resistor and second resistor are substantially identically configured.

3. The amplifier of claim 2 wherein the gain of the amplifier is related to the resistance of said third resistor.

4. The amplifier of claim 1 wherein said first diode network and second diode network are substantially identically configured.

5. The amplifier of claim 1 wherein said first output amplifier and second output amplifier are identically configured.

6. The amplifier of claim 1 wherein said third resistor is variable.

7. The amplifier of claim 6 wherein said third resistor comprises
   an input conductor and an output conductor;
   a series resistive element coupled between said input conductor and said output conductor; and
   a plurality of successive parallel controllable resistive elements each coupled to said output conductor.

8. The amplifier of claim 7 wherein said plurality of parallel controllable resistive elements each have a control terminal coupled to a control circuit.

9. The amplifier of claim 8 wherein said control circuit is configured to produce a plurality of control signals on said control terminals so as to couple the controllable resistive elements to the output conductor and to change the resistance of the controllable resistive elements based on said plurality of control signals.

10. The amplifier of claim 7 wherein said single series resistive element includes a MOSFET wherein a gate of said MOSFET is coupled to a reference voltage.

11. The amplifier of claim 10 wherein each of said parallel resistive elements includes a MOSFET that also functions as a switching element to controllably couple each resistive element to the output conductor.

12. The amplifier of claim 1 wherein said diode network comprises a plurality of diodes configured to dissipate excess charge upon the presence of a predetermined voltage level.

13. A method of amplifying an input signal comprising:
    sensing an input voltage signal;
    converting said input voltage signal into a current signal;
    inputting said current signal into a transimpedance amplifier to form an output voltage signal; and
    clamping said output voltage signal if said voltage signal exceeds a predetermined value,
    wherein said converting step is performed by a variable resistor coupled to a buffer amplifier.

14. The method of claim 13 further comprising:
    setting the gain of the amplifier via setting the resistance of said variable resistor.

15. The method of claim 13 wherein said input voltage signal is a differential voltage signal;
    said current signal is a differential current signal; and
    said output voltage signal is a differential voltage signal.

* * * * *